(12) United States Patent
Lee

(10) Patent No.: US 8,531,003 B2
(45) Date of Patent: Sep. 10, 2013

(54) SEMICONDUCTOR DEVICE AND MANUFACTURING METHOD OF THE SAME

(75) Inventor: Chang Eun Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/471,183

(22) Filed: May 14, 2012

(65) Prior Publication Data

US 2013/0093055 A1    Apr. 18, 2013

(30) Foreign Application Priority Data

Oct. 14, 2011  (KR) .................. 10-2011-0104935

(51) Int. Cl.
*H01L 29/00*    (2006.01)
(52) U.S. Cl.
USPC ............ 257/536; 438/384; 257/E29.141; 257/E21.495
(58) Field of Classification Search
USPC ........... 438/238, 329, 330, 381, 382, 384; 257/489, 536, 537, E29.141, E29.176, E21.294, 257/E21.495
See application file for complete search history.

(56) References Cited

U.S. PATENT DOCUMENTS 7,403,094 B2 * 7/2008 Beach et al. .................. 338/309
2012/0049323 A1 * 3/2012 Ng et al. ........................ 257/537

FOREIGN PATENT DOCUMENTS

KR    10-2006-0010446 A    2/2006
KR    10-2011-0078927 A    7/2011

OTHER PUBLICATIONS

Office Action Dated Jan. 8, 2013; Korean Patent Application No. 10-2011-0104935.
English Abstract for Korean Patent Publication No. 1020110078927A, Published Jul. 7, 2011.
English Abstract for Korean Patent Publication No. 1020060010446A, Published Feb. 2, 2006.

* cited by examiner

*Primary Examiner* — Brook Kebede
(74) *Attorney, Agent, or Firm* — Murabito, Hao & Barnes LLP; Andrew D. Fortney

(57) ABSTRACT

Provided is a semiconductor device. The semiconductor device includes a first insulation layer on a semiconductor substrate, the first insulation layer including a lower metal line, a metal head pattern on the first insulation layer, the metal head pattern including an inclined side surface, a thin film resistor pattern on the metal head pattern, a second insulation layer on the metal head pattern and the thin film resistor pattern, an upper metal line on the second insulation layer, a first via connecting the lower metal line to the upper metal line, and a second via connecting the metal head pattern to the upper metal line.

20 Claims, 7 Drawing Sheets

SEMICONDUCTOR DEVICE AND MANUFACTURING METHOD OF THE SAME

CROSS-REFERENCE TO RELATED APPLICATIONS

This application claims priority under 35 U.S.C. §119 to Korean Patent Application No. 10-2011-0104935, filed Oct. 14, 2011, which is hereby incorporated by reference.

BACKGROUND

Passive devices perform important functions in an electronic system. Recently, making miniaturized, multi-functional, and economical electronic appliances has given rise to requirements for passive devices to be fabricated in the form of an array, a network, and a built-in passive device. Such passive devices sense, monitor, transmit, reduce, and control voltage.

Resistors as passive devices may suppress a flow of electric charge current, thereby controlling the amount of current. Such passive devices may be classified as a thin film resistor, in which a metal layer is thinly deposited to form a pattern, and an active layer resistor using an active layer area. Among these, the thin film resistor is generally positioned between metal lines of a semiconductor device.

FIGS. 1 and 2 are sectional views of a semiconductor device including a thin film resistor pattern according to the related art. Referring to FIG. 1, a semiconductor device includes a first insulation layer 21 disposed on a semiconductor substrate 10, lower metal lines 30 and 31 disposed on the first insulation layer 21, and a thin film resistor pattern 40 connecting the lower metal lines 30 and 31 to each other. FIG. 1 illustrates a simple process in which the thin film resistor pattern 40 is directly formed after the lower metal lines 30 and are formed. However, the thin film resistor pattern 40 is generally formed using a sputtering process. Thus, it is difficult to uniformly form the thin film resistor pattern 40 on edge portions of the lower metal lines 30 and 31 because the thin film resistor pattern 40 has a thickness of at least about an order of magnitude less than that of each of the lower metal lines 30 and 31. Thus, it is difficult to precisely form a thin film resistor by this process.

In the semiconductor device of FIG. 2, a thin film resistor head contact pattern 51 and a thin film resistor head pattern 52 are formed on a thin film resistor pattern 40, and the thin film resistor head pattern 52 and a via 71 are connected to each other. The semiconductor device of FIG. 2 has a relatively complicated manufacturing process because four patterning and etching processes are required to form the thin film resistor 40, the thin film resistor head contact pattern 51, thin film resistor head pattern 52, and via 71. Also, to prevent the thin film resistor pattern 40 from being damaged in the etching process, both dry and wet etching processes (oxide etch, HF-based, etc.) are performed. The HF-based process is used in a front end of the line (FEOL) process, but is not used in a back end of the line (BEOL) process. To prevent metallic contamination, equipment designated for patterning the thin film resistor is required.

Also, stress generated by a thermal expansion difference between the thin film resistor head pattern 52 and the thin film resistor pattern 40 may be increased as the thin film resistor head pattern 52 is increased in size. This may cause non-uniform resistance of the thin film resistor head pattern 52 and increase resistance dispersion.

SUMMARY

Embodiments of the present disclosure provide a semiconductor device including a thin film resistor pattern having a relatively stable resistance and a method of manufacturing the same.

In one embodiment, the semiconductor device may include a first insulation layer on a semiconductor substrate, the first insulation layer including a lower metal line; a metal head pattern on the first insulation layer, the metal head pattern including an inclined side surface; a thin film resistor pattern on the metal head pattern; a second insulation layer on the metal head pattern and the thin film resistor pattern; an upper metal line on the second insulation layer; a first via connecting the lower metal line to the upper metal line; and a second via connecting the metal head pattern to the upper metal line.

In the semiconductor device according to an embodiment, the thin film resistor pattern may have a metal head pattern with an inclined side surface. Thus, a resistance change of the thin film resistor pattern, which may occur due to a height difference when the thin film resistor pattern is deposited, may be minimized.

In the method of manufacturing a semiconductor device according to an embodiment, a metal head pattern having an inclined side surface may be formed without a separate spacer, and therefore the number of patterning and etching processes may be reduced to simplify the manufacturing process, thereby reducing manufacturing costs.

Also, in the method of manufacturing the semiconductor device according to an embodiment, the metal head pattern may be formed prior to the thin film resistor pattern to reduce stress due to a thermal expansion difference between the metal head pattern and the thin film resistor pattern, thereby forming a relatively stable thin film resistor.

The details of various embodiments are set forth in the accompanying drawings and the description below. Other features will be apparent from the description and drawings, and from the claims.

DETAILED DESCRIPTION

Hereinafter, semiconductor devices and methods of manufacturing the same according to embodiments of the present disclosure will be described with reference to the accompanying drawings.

Figure 1:
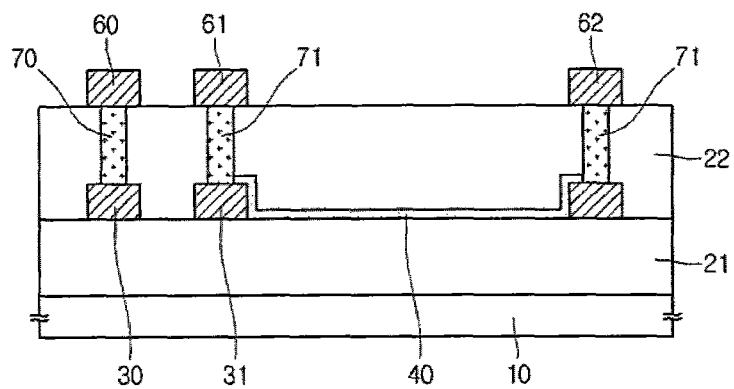
FIGS. 1 and 2 are cross-sectional views of a semiconductor device including a thin film resistor pattern according to the related art.
Figure 2:
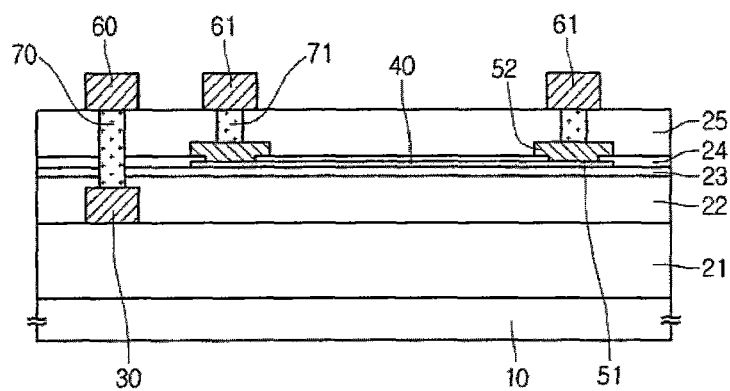
Figure 3:
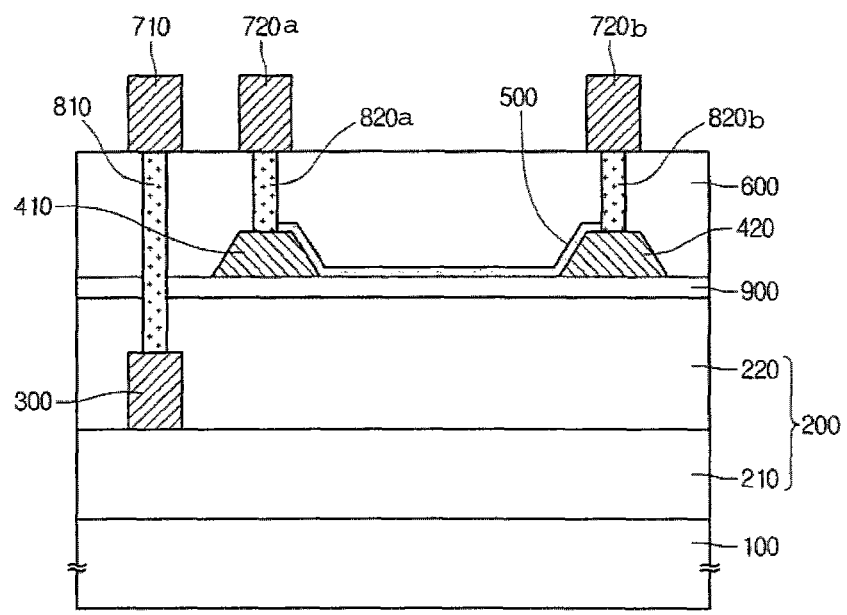
FIGS. 3 and 4 are cross-sectional views of a semiconductor device according to an embodiment of the present disclosure.
Figure 4:
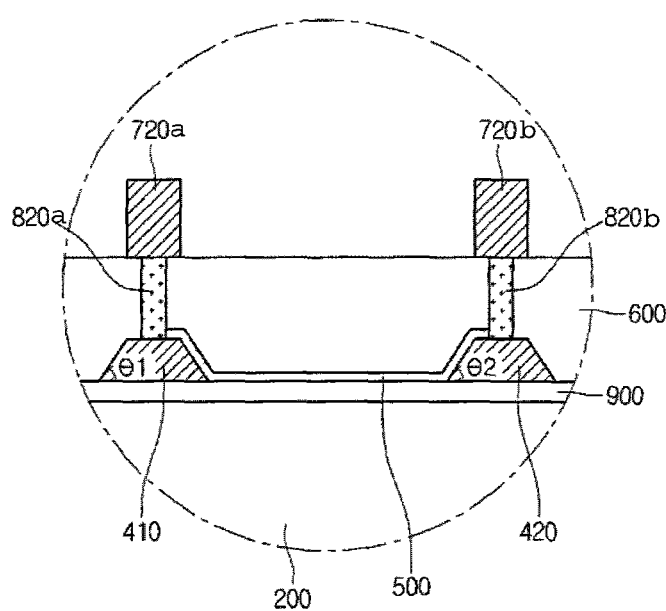

FIGS. 3 and 4 are cross-sectional views of a semiconductor device according to one embodiment of the present invention. FIGS. 5 to 8 and 10 to 13 are cross-sectional views illustrating various steps in a process of manufacturing a semiconductor device according to an embodiment of the present disclosure.

Referring to FIG. 3, a semiconductor device according to an exemplary embodiment includes a first insulation layer 200 on a semiconductor substrate 100. The semiconductor device also includes a lower metal line 300, and metal head patterns 410 and 420 on the first insulation layer 200, where the metal head patterns 410 and 420 have inclined side surfaces. The semiconductor device further includes a thin film resistor pattern 500 on the metal head patterns 410 and 420, and a second insulation layer 600 on the metal head patterns 410 and 420 and the thin film resistor pattern 500. The semiconductor device also includes upper metal lines 710 and 720a-b on the second insulation layer 600, a first via 810 connecting the lower metal line 300 to the upper metal line 710, and second vias 820a-b connecting the metal head patterns 410 and 420 to the upper metal lines 720a-b. In addition, a third insulation layer 900 may be between the first insulation layer 200 and the second insulation layer 600, but the invention is not limited thereto.

FIG. 4 is a detailed cross-sectional view of the metal head patterns 410 and 420 and the thin film resistor pattern 500 according to embodiments of the present invention.

The metal head patterns 410 and 420 have inclined side surfaces, respectively. Although the metal head patterns 410 and 420 are shown as having a flatly (or substantially planar) inclined side surface in FIG. 4, the invention is not limited thereto. On the contrary, in some embodiments, the side surface(s) of each of the metal head patterns 410 and 420 may have a bent or curved (e.g., concave or convex) shape.

Also, the side surface of each of the metal head patterns 410 and 420 may be inclined upward at an angle of about 50° to about 80° with respect to the semiconductor substrate 100. In some instances, an angle between each of the metal head patterns 410 and 420 and the semiconductor substrate 100 may be about 60° to about 80° (or any value or range of values therein), but the invention is not limited thereto.

For example, when an angle between the first metal head pattern 410 and the semiconductor substrate 100 is θ1, and an angle between the second metal head pattern 420 and the semiconductor substrate 100 is θ2, the angles θ1 and θ2 may be about 50° to about 80°, respectively. Also, the angles θ1 and θ2 may be the same as or different from each other. Also, each of the metal head patterns 410 and 420 may have a width of about 0.1 μm to about 2 μm, but the present disclosure is not limited thereto.

In some embodiments, the metal head patterns 410 and 420 include a first metal head pattern 410 on the first insulation layer 200, and a second metal head pattern 420 on an area adjacent to the first metal head pattern 410. Although two metal head patterns 410 and 420 are illustrated in FIGS. 3 and 4, the present disclosure is not limited thereto. For example, two, three or more metal head patterns may be provided.

In some exemplary embodiments, the thin film resistor pattern 500 is between and in contact with the first metal head pattern 410 and the second metal head pattern 420. The thin film resistor pattern 500 may be formed on top surface and side surfaces of the first and second metal head patterns 410 and 420, respectively. In some embodiments, the thin film resistor pattern 500 may be formed on a portion of the top surface of the first metal head pattern 410, the side surface of the first metal head pattern 420, the first insulation layer 200 between the first metal head pattern 410 and the second metal head pattern 420, the side surface of the second metal head pattern 420, and a portion of the top surface of the second metal head pattern 420. Optionally, the thin film resistor pattern 500 may be on only the side surfaces of the metal head patterns 410 and 420.

Also, the semiconductor device may have second vias 820a-b in contact with the top surface of the metal head patterns 410 and 420. An end of the thin film resistor pattern 500 and the second via 820 may contact each other on the top surface of each of the metal head patterns 410 and 420, but not necessarily. Here, the second vias 820a-b may pass through the second insulation layer 600 to electrically connect the upper metal lines 720a-b, the metal head patterns 410 and 420, and the thin film resistor pattern 500 to each other. As described above, the thin film resistor pattern 500 is on the inclined side surfaces of the metal head patterns 410 and 420. Thus, in the semiconductor device according to an embodiment of the present disclosure, a resistance change of the thin film resistor pattern 500, which may occur by a height difference when the thin film resistor pattern 500 is formed, may be minimized.

FIGS. 5 to 8 and FIGS. 10 to 13 are cross-sectional views illustrating a process of manufacturing a semiconductor device according to various embodiments of the present disclosure. The manufacturing method will be described with reference to the above-described semiconductor device.

Figure 5:
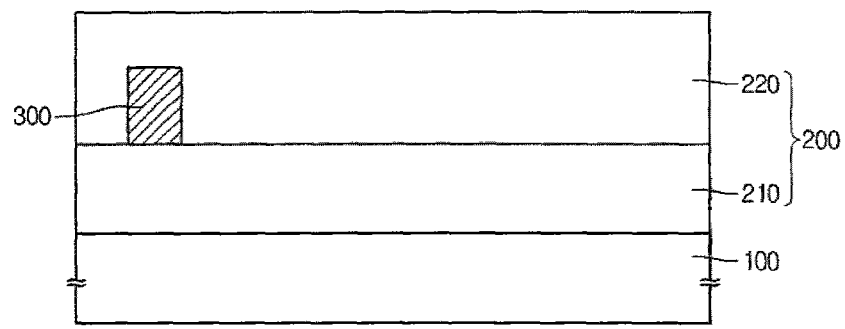
FIGS. 5 to 8 and FIGS. 10 to 13 are cross-sectional views illustrating processes in manufacturing a semiconductor device according to an embodiment of the present disclosure.
Figure 6:
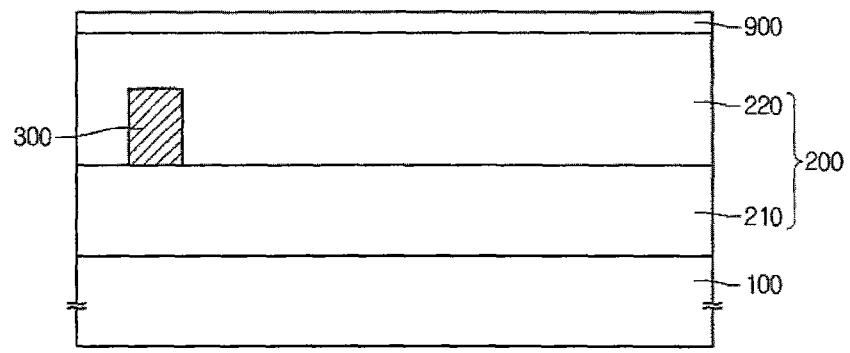

Referring to FIGS. 5 and 6, a first insulation layer 200, including a lower metal line 300, is formed on a semiconductor substrate 100. Also, a third insulation layer 900 may be additionally formed on the first insulation layer 200, but the disclosure is not limited thereto. Each of the first insulation layer 200 and the third insulation layer 900 may comprise or consist essentially of an oxide layer (e.g., a silicon dioxide, which may be doped with [i] fluorine or [ii] boron and/or phosphorous, and formed by chemical vapor deposition from a silicon source such as silane or tetraethyl-orthosilicate (TEOS) and an oxygen source such as dioxygen [$O_2$] or ozone [$O_3$]. etc.), but the disclosure is not limited thereto. The insulation layer(s) may further comprise a nitride (e.g., silicon nitride), an oxynitride (e.g., silicon oxynitride) or oxycarbide (e.g., SiOC or SiOCH), or any other suitable insulating material known in the art.

The first insulation layer 200 and the third insulation layer 900 may comprise the same material(s) and/or have the same thickness(es). However, the invention is not limited as such, and the insulation layers may also comprise different materials and/or have different thicknesses. In some embodiments, the insulating layer(s) may be formed by chemical vapor deposition (CVD, which may be plasma-assisted, plasma-enhanced, or high density plasma [HDP] CVD).

Also, each of the first insulation layer 200 and the third insulation layer 900 may be formed as a single layer or a plurality of layers (e.g., silicon nitride, silicon dioxide on silicon nitride, a silicon dioxide/fluorosilicate glass/silicon dioxide stack, etc.). For example, in some embodiments, the first insulation layer 200 may include a first insulation sub-layer 210 and a second insulation sub-layer 220 on the semiconductor substrate 100. Here, the first insulation sub-layer 210 may be a pre-metal-dielectric (PMD), and the second insulation sub-layer 220 may be an intermetal dielectric (IMD). Although not shown in the figures, the first insulation layer 200 may include a plurality of metal patterns (not shown), but the disclosure is not limited thereto. The metal patterns (not shown) may be regularly or irregularly formed.

Figure 7:
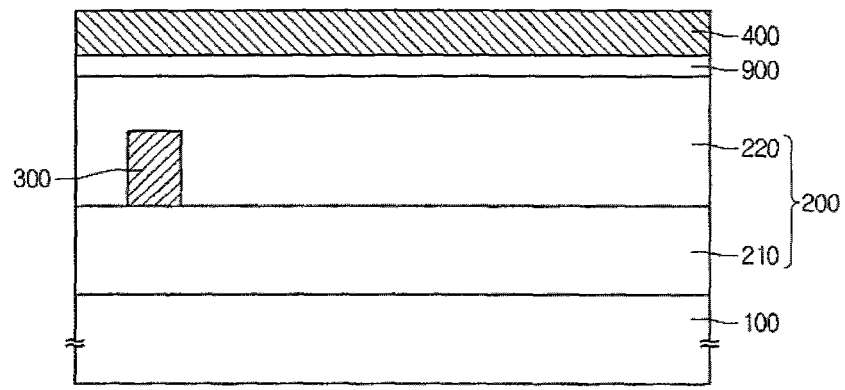
Figure 8:
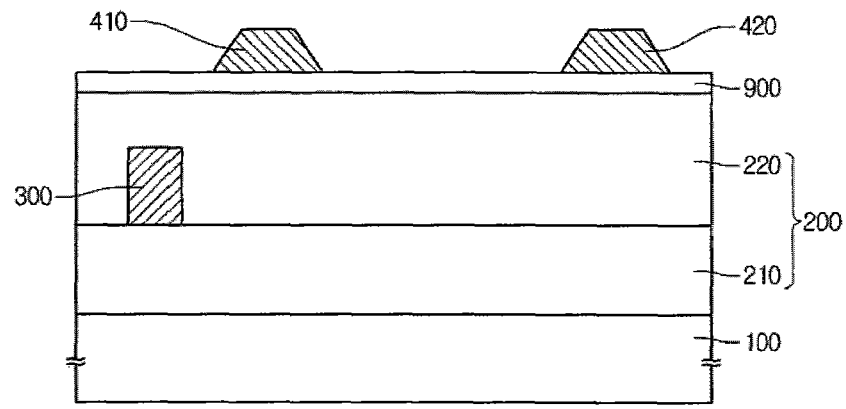

Referring to FIGS. 7 and 8, a metal head layer 400 is formed on the first insulation layer 200. Then, the metal head layer 400 is etched to form metal head patterns 410 and 420 (FIG. 8). In some embodiments, the metal head layer and the metal head patterns 410 and 420 may directly contact the third insulation layer 900.

For example, the metal head layer 400 may be manufactured by depositing at least one material selected from the group consisting of Ti, TiN, Al, Ta, TaN, W, and combinations, alloys, and conductive compounds thereof through physical vapor deposition (PVD), chemical vapor deposition (CVD), or any other suitable method known in the art. For example, in some embodiments, the metal head layer 400 may comprise aluminum or an aluminum alloy (e.g., Al with up to 4 wt. % Cu, up to 2 wt. % Ti, and/or up to 1 wt. % Si), and may be deposited by sputtering on a conventional adhesion and/or barrier layer (e.g., Ti and/or TiN, such as a TiN-on-Ti bilayer).

After the metal head layer 400 is deposited on the first insulation layer 200, the metal head layer 400 may be selectively etched, for example, using a chemical etching gas. The metal head patterns 410 and 420 are formed through the etching process. The metal head patterns 410 and 420 may serve as an etch stop layer in an etching process for forming a first via 810 and a second via 820. Thus, when the metal head layer 400 (FIG. 7) comprises Al, the metal head layer 400 may further comprise a Ti, TiN, or TiN-on-Ti surface or cap layer.

In the etching process, side surfaces of the metal head patterns 410 and 420 can be formed with an inclined angle (e.g., 50° to about 80°, or any value or range of values therein) relative to the semiconductor substrate. For example, a mixed gas containing a hydrofluorocarbon (e.g., $CHF_3$, $CH_2F_2$, $C_2HF_5$, $C_2H_2F_4$, etc.), a chlorine source (e.g., $Cl_2$ and/or $BCl_3$), and optionally, a noble and/or inert gas (e.g., Ar, Ne, Kr, $N_2$, etc.). For example, a mixture of Ar, $N_2$, $CHF_3$, $Cl_2$, and $BCl_3$ may be used as the chemical etching gas. In some instances, the chemical etching gas may contain only $CHF_3$ and $BCl_3$. That is, in the method of manufacturing the semiconductor device according to the present disclosure, a composition of the mixed gas may be adequately adjusted to easily form the metal head patterns 410 and 420 having the inclined side surfaces.

Also, in the method of manufacturing the semiconductor device according to an embodiment of the present disclosure, the metal head patterns 410 and 420 may be formed prior to the thin film resistor pattern 500 to reduce stress due to a thermal expansion difference between the metal head patterns 410 and 420 and the thin film resistor pattern 500.

Figure 9A:
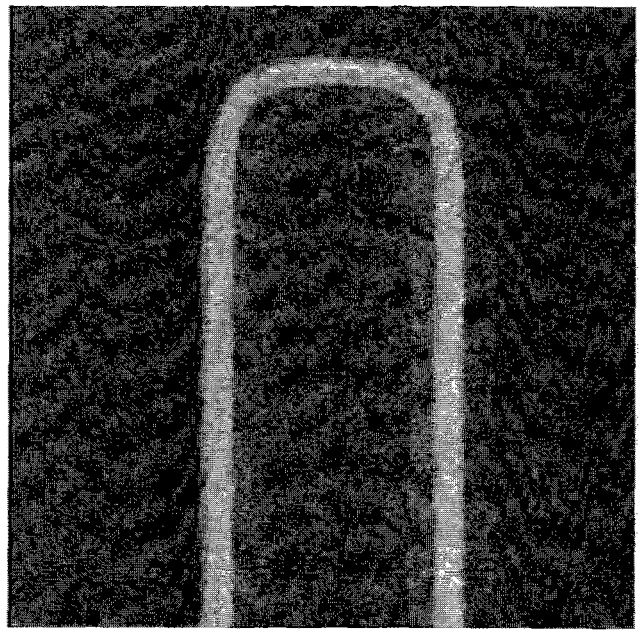
FIGS. 9A-9C are photographs illustrating a top surface of a metal head pattern, photographed using a scanning electron microscope (SEM), according to an embodiment of the present disclosure.
Figure 9B:
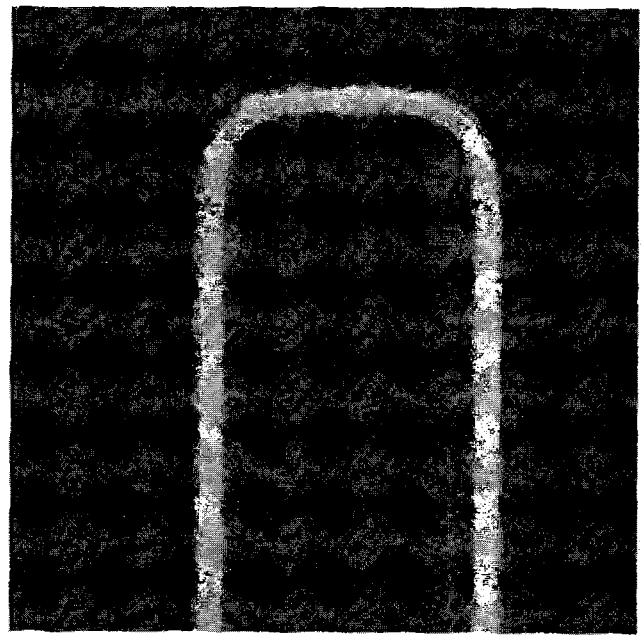
Figure 9C:
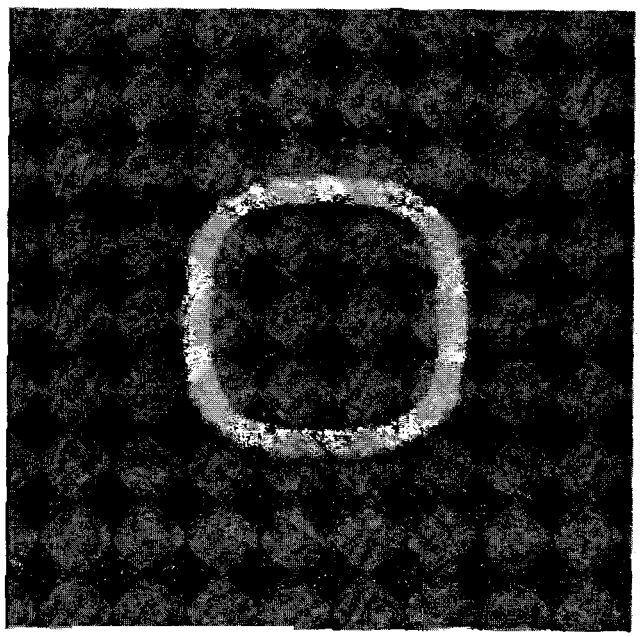

The images in FIGS. 9A to 9C illustrate the metal head patterns 410 and 420, which are manufactured according to the above-described method(s) and photographed using a scanning electron microscope (SEM). FIG. 9A illustrates a top surface of a metal head pattern having a width of about 0.9 μm and a length of about 9.9 μm. FIG. 9B illustrates a top surface of a metal head pattern having a width of about 1.1 μm and a length of about 9.9 μm. FIG. 9C illustrates a top surface of a metal head pattern having a width of about 1 μm and a length of about 1 μm. The bright portion(s) in each of FIGS. 9A to 9C represent an inclined side surface of the metal head pattern, and the dark portion(s) surrounded by the bright portion(s) represent a top surface of the metal head pattern. Referring again to FIGS. 9A to 9C, from the photos and the known thickness of the metal head pattern, the side surface of each of the metal head pattern may have an inclined side surface of about 67° and can be easily formed.

Figure 10:
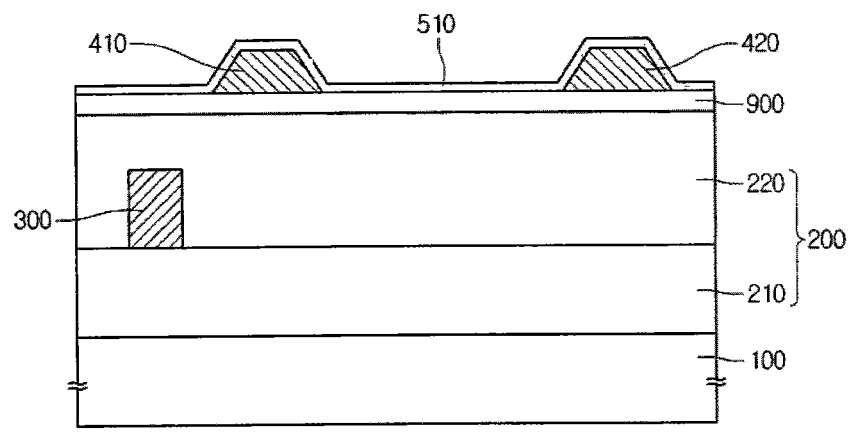
Figure 11:
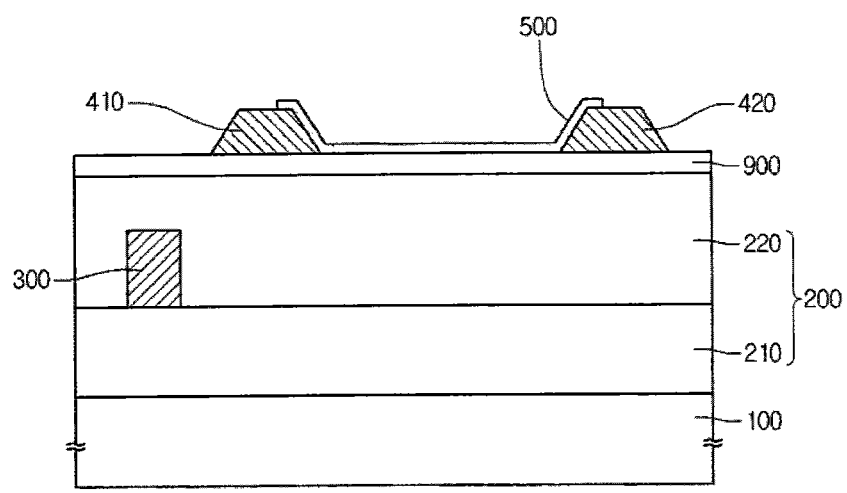

Referring now to FIGS. 10 and 11, a thin film resistor pattern 500 is formed on metal head patterns 410 and 420. A thin film resistor material 510 may be deposited on the metal head patterns 410 and 420 using any suitable method known in the art, and then a portion of the thin film resistor material 510 may be etched to form the thin film resistor pattern 500.

Materials ordinarily used as a thin film resistor in the art may be used as the thin film resistor material 510 without specific limitations. For example, the thin film resistor material 510 may comprise or consist essentially of at least one compound selected from the group consisting of CrSi, NiCr, TaN, $CrSi_2$, CrSiN, CrSiO, and combinations thereof, but the disclosure is not limited thereto. For example, the thin film resistor material 510 may be formed by depositing SiCr or NiCr on the third insulation layer 900 at a thickness of about 10 Å to about 1,000 Å through a sputtering process.

Thereafter, a photoresist pattern (not shown) is formed on the thin film resistor material 510, and then a photolithography process and an etching process are performed to form the thin film resistor pattern 500. Through the etching process, the thin film resistor pattern 500 overlapping the third insulation layer 900 and a portion of areas of the metal head patterns 410 and 420 adjacent to the third insulation layer may be formed. For example, the thin film resistor pattern 500 may be formed on a top surface of the first metal head pattern 410, a side surface of the first metal head pattern 420, the third insulation layer 900 between the first metal head pattern 410 and the second metal head pattern 420, a side surface of the second metal head pattern 420, and a top surface of the second metal head pattern 420, although it is not necessary for the thin film resistor pattern 500 to be on the top surfaces of metal head patterns 410 and 420 as long as the thin film resistor pattern 400 makes ohmic contact with metal head patterns 410 and 420.

In general, since a thin film resistor pattern is formed using a relatively thin resistor, when a contact or via connecting a line on the resistor is formed, it may be difficult to form the contact or via on the thin resistor without encountering contact resistance problems. That is, to stably contact the via or contact, it may be desirable for the thin film resistor pattern to have a thickness of about 1,000 Å or more. However, since the thin film resistor pattern described herein may have a thickness of about 10 Å to about 500 Å, when the via or contact passes through the thin film resistor, the contact resistance may be increased. This may limit the resistance characteristics of the thin film resistor pattern.

To overcome the above-described limitation(s), in the present manufacturing method, the thin film resistor pattern 500 may be formed on the metal head patterns 410 and 420 to reduce the number of mask layers used in manufacturing the thin film resistor pattern, and to integrate the thin film resistor pattern 500 using a general semiconductor process.

Figure 12:
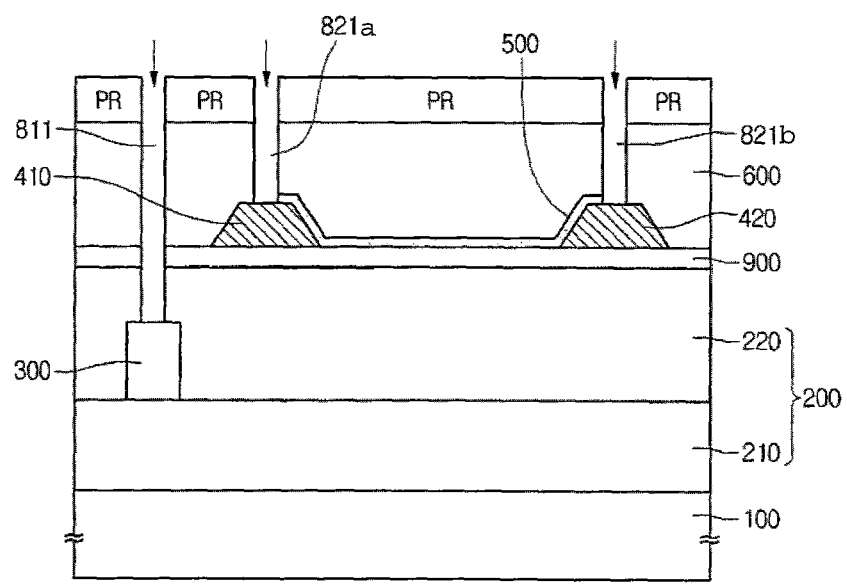

Referring to FIG. 12, a second insulation layer 600 is formed on the metal head patterns 410 and 420 and the thin film resistor pattern 500, and a portion of the second insulation layer 600 is etched to form a first via hole 811 and second via holes 821*a-b*. The second insulation layer 600 may comprise any suitable insulating material known in the art (e.g., silicon dioxide, $SiO_2$ doped with F or B and/or P, silicon nitride, combinations thereof, etc.).

For example, a photoresist layer (PR) having openings corresponding to the lower metal line 300 and the metal head patterns 410 and 420 is formed on the second insulation layer 600, and a photolithography process and an etching process are performed. The second insulation layer 600 and the first insulation layer 200 are etched through the opening corresponding to the lower metal line 300 to form the first via hole 811 exposing a top surface of the lower metal line 300. Simultaneously, the second insulation layer 600 is etched through the openings corresponding to each of the metal head patterns 410 and 420 to form the second via holes 821*a-b* exposing each of the metal head patterns 410 and 420. In the process for forming the second via holes 821*a-b*, a portion of the thin film resistor pattern 500 formed on the metal head patterns 410 and 420 may be etched, but the disclosure is not limited thereto. Thereafter, the photoresist pattern (PR) is removed, for example, through an asking or striping process.

Each of the first and second via holes 811 and 821a-b formed by the above-described method may have a width of about 0.5 µm or more and a depth of about 1,000 Å to about 9,000 Å.

Figure 13:
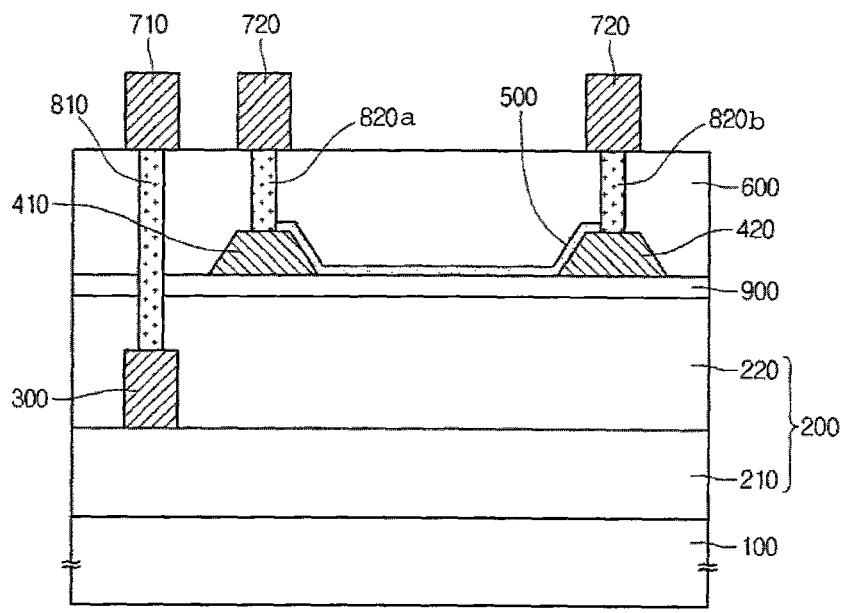

Referring to FIG. 13, a metal material is deposited into the first and second via holes 811 and 821a-b to form a first via 810 and second vias 820a-b. The metal material may comprise any conductive or conventional via material known in the art (e.g., tungsten, doped silicon, aluminum, copper, etc.), and the metal material may be deposited using any suitable method known in the art for depositing such metal material to form a via. A planarization process may be additionally performed after the metal material is deposited, but the disclosure is not limited thereto. Sequentially, upper metal lines 710 and 720 may be formed on the first and second vias 810 and 820a-b. The upper metal lines 710 and 720 may include various conductive materials such as metals, alloys and/or silicides. For example, the upper metal lines 710 and 720 may include aluminum, copper, cobalt, tungsten and the like. The upper metal lines 710 and 720 may be formed using any suitable method known in the art (e.g., blanket deposition and patterning). In some exemplary embodiments, one portion of the upper metal line 710 may be connected to the lower metal line 300 through the first via 810, and another portion of the upper metal line 720 may be connected to the metal head patterns 410 and 420 and the thin film resistor pattern 500 through the second vias 820a-b.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to affect such feature, structure, or characteristic in connection with other embodiments.

What is claimed is:

1. A semiconductor device, comprising:
   a first insulation layer on a semiconductor substrate, the first insulation layer comprising a lower metal line;
   a metal head pattern on the first insulation layer, the metal head pattern comprising an inclined side surface;
   a thin film resistor pattern on the metal head pattern;
   a second insulation layer on the metal head pattern and the thin film resistor pattern;
   an upper metal line on the second insulation layer;
   a first via connecting the lower metal line to the upper metal line; and
   a second via connecting the metal head pattern to the upper metal line.

2. The semiconductor device according to claim 1, wherein the side surface of the metal head pattern is inclined at an angle of about 50° to about 80°.

3. The semiconductor device according to claim 1, wherein the metal head pattern has a lowermost surface greater than a corresponding uppermost surface.

4. The semiconductor device according to claim 1, wherein the metal head pattern comprises a first metal head pattern on the first insulation layer and a second metal head pattern in an area adjacent to the first metal head pattern.

5. The semiconductor device according to claim 4, wherein the thin film resistor pattern is between the first metal head pattern and the second metal head pattern.

6. The semiconductor device according to claim 5, wherein the thin film resistor pattern is on a side surface of the first metal head pattern, the first insulation layer, and a side surface of the second metal head pattern.

7. The semiconductor device according to claim 6, wherein the thin film resistor pattern is also on a portion of a top surface of the first metal head pattern and a portion of a top surface of the second metal head pattern.

8. The semiconductor device according to claim 1, wherein the second via contacts a top surface of the metal head pattern.

9. The semiconductor device according to claim 1, wherein the second via contacts the thin film resistor pattern.

10. The semiconductor device according to claim 1, wherein the first via passes through the first and second insulation layers, and the second via passes through the second insulation layer.

11. The semiconductor device according to claim 1, wherein the first insulation layer comprises a plurality of layers, including a pre-metal dielectric layer and an inter-metal dielectric layer.

12. A method of manufacturing a semiconductor device, comprising:
   forming a first insulation layer comprising a lower metal line on a semiconductor substrate;
   forming a metal head pattern comprising an inclined side surface on the first insulation layer;
   forming a thin film resistor pattern on top and side surfaces of the metal head pattern;
   forming a second insulation layer on the metal head pattern and the thin film resistor pattern; and
   simultaneously forming a first via passing through the first and second insulation layers and connected to the lower metal line and a second via passing through the second insulation layer and connected to the metal head pattern.

13. The method according to claim 12, wherein forming the metal head pattern comprises:
   forming a metal head layer on the first insulation layer; and
   etching the metal head layer using a chemical etching gas comprising $CHF_3$ and $BCl_3$.

14. The method according to claim 13, wherein forming the metal head layer comprises depositing at least one of Ti, TiN, Al, Ta, TaN, W, or a combination thereof by physical vapor deposition or chemical vapor deposition.

15. The method according to claim 12, wherein forming the first and second vias comprises:
   forming a photoresist pattern having openings corresponding to the lower metal line and the metal head pattern on the second insulation layer;
   etching the second insulation layer and the first insulation layer to form a first via hole exposing the lower metal line;
   etching the second insulation layer to form a second via hole exposing a top surface of the metal head pattern; and
   filling the first and second via holes with a metal material.

16. The method according to claim 15, further comprising performing a planarization process after filling the via holes.

17. The method according to claim 12, further comprising forming a third insulation layer on the first insulation layer, wherein the metal head pattern directly contacts the third insulation layer.

18. The method according to claim 12, wherein forming the thin film resistor pattern comprises depositing a thin film resistor material on the metal head pattern and etching a portion of the thin film resistor material.

19. The method according to claim 18, wherein the thin film resistor material comprises at least one of CrSi, NiCr, TaN, $CrSi_2$, CrSiN, CrSiO, or a combination thereof.

20. The method according to claim 12, further comprising forming an upper metal line on the first and second vias, wherein a first portion of the upper metal line is connected to the lower metal line through the first via, and a second portion of the upper metal line is connected to the metal head pattern and the thin film resistor pattern through the second via.

* * * * *